(12) United States Patent
Kamei et al.

(10) Patent No.: US 10,319,605 B2
(45) Date of Patent: Jun. 11, 2019

(54) SEMICONDUCTOR TREATMENT COMPOSITION AND TREATMENT METHOD

(71) Applicant: JSR Corporation, Minato-ku (JP)

(72) Inventors: Yasutaka Kamei, Minato-ku (JP); Takahiro Hayama, Minato-ku (JP); Naoki Nishiguchi, Minato-ku (JP); Satoshi Kamo, Minato-ku (JP); Tomotaka Shinoda, Minato-ku (JP)

(73) Assignee: JSR Corporation, Minato-ku (JP)

(*) Notice: Subject to any disclaimer, the term of this patent is extended or adjusted under 35 U.S.C. 154(b) by 0 days.

(21) Appl. No.: 15/584,168

(22) Filed: May 2, 2017

(65) Prior Publication Data

US 2017/0330763 A1 Nov. 16, 2017

(30) Foreign Application Priority Data

| May 10, 2016 | (JP) | 2016-094397 |
| Dec. 8, 2016 | (TW) | 105140526 A |
| Feb. 8, 2017 | (KR) | 10-2017-0017333 |
| Apr. 12, 2017 | (CN) | 2017 1 0238028 |

(51) Int. Cl.

| *H01L 21/321* | (2006.01) |
| *C09G 1/04* | (2006.01) |
| *C09G 1/00* | (2006.01) |
| *C09G 1/06* | (2006.01) |
| *C09K 13/06* | (2006.01) |
| *C09G 1/02* | (2006.01) |

(Continued)

(52) U.S. Cl.
CPC ............ *H01L 21/3212* (2013.01); *B24B 1/00* (2013.01); *B24B 37/044* (2013.01); *C09G 1/00* (2013.01); *C09G 1/02* (2013.01); *C09G 1/04* (2013.01); *C09G 1/06* (2013.01); *C09K 3/1454* (2013.01); *C09K 3/1463* (2013.01); *C09K 13/06* (2013.01); *C11D 3/14* (2013.01); *C11D 7/20* (2013.01); *C11D 11/0047* (2013.01); *H01L 21/02074* (2013.01); *H01L 21/30625* (2013.01)

(58) Field of Classification Search
None
See application file for complete search history.

(56) References Cited

U.S. PATENT DOCUMENTS

| 5,958,288 A | 9/1999 | Mueller et al. |
| 5,980,775 A | 11/1999 | Grumbine et al. |

(Continued)

FOREIGN PATENT DOCUMENTS

| JP | 10-265766 A | 10/1998 |
| JP | 2000-208451 A | 7/2000 |

(Continued)

OTHER PUBLICATIONS

Notification of Reasons for Refusal dated Jul. 6, 2016 in Japanese Patent Application No. 2016-094397 (with English translation).

(Continued)

*Primary Examiner* — Jiong-Ping Lu
(74) *Attorney, Agent, or Firm* — Oblon, McClelland, Maier & Neustadt, L.L.P.

(57) ABSTRACT

A semiconductor treatment composition includes particles having a particle size of 0.1 to 0.3 micrometers in a number of $3 \times 10^1$ to $1.5 \times 10^3$ per mL.

20 Claims, 2 Drawing Sheets

(51) Int. Cl.
   *C09K 3/14*   (2006.01)
   *B24B 1/00*   (2006.01)
   *B24B 37/04*  (2012.01)
   *H01L 21/306* (2006.01)
   *H01L 21/02*  (2006.01)
   *C11D 3/14*   (2006.01)
   *C11D 7/20*   (2006.01)
   *C11D 11/00*  (2006.01)

(56) References Cited

U.S. PATENT DOCUMENTS

| | | | |
|---|---|---|---|
| 6,015,506 | A  | 1/2000  | Streinz et al. |
| 6,068,787 | A  | 5/2000  | Grumbine et al. |
| 6,338,744 | B1 | 1/2002  | Tateyama et al. |
| 6,663,722 | B1 | 12/2003 | Higashino et al. |
| 6,896,744 | B2 | 5/2005  | Morinaga et al. |
| 7,435,712 | B2 | 10/2008 | Misra et al. |
| 7,498,295 | B2 | 3/2009  | Fisher et al. |
| 9,074,170 | B2 | 7/2015  | Barnes et al. |
| 9,528,078 | B2 | 12/2016 | Angst et al. |
| 2003/0087524 | A1 | 5/2003  | Aoki et al. |
| 2003/0130147 | A1 | 7/2003  | Koito et al. |
| 2003/0130149 | A1 | 7/2003  | Zhou et al. |
| 2003/0144163 | A1 | 7/2003  | Morinaga et al. |
| 2004/0038840 | A1 | 2/2004  | Lee et al. |
| 2004/0099290 | A1 | 5/2004  | Morinaga et al. |
| 2005/0176606 | A1 | 8/2005  | Konno et al. |
| 2005/0181961 | A1 | 8/2005  | Misra et al. |
| 2005/0187326 | A1 | 8/2005  | Nakazawa |
| 2005/0284844 | A1 | 12/2005 | Hattori et al. |
| 2008/0047592 | A1 | 2/2008  | Fisher et al. |
| 2009/0239777 | A1 | 9/2009  | Angst et al. |
| 2010/0056410 | A1 | 3/2010  | Visintin et al. |
| 2010/0311630 | A1 | 12/2010 | Mori et al. |
| 2011/0076852 | A1 | 3/2011  | Takahashi et al. |
| 2012/0042898 | A1 | 2/2012  | Visintin et al. |
| 2012/0283163 | A1 | 11/2012 | Barnes et al. |
| 2013/0143785 | A1 | 6/2013  | Taniguchi et al. |
| 2015/0210966 | A1 | 7/2015  | Shimada et al. |
| 2016/0177457 | A1 | 6/2016  | Yokomizo et al. |

FOREIGN PATENT DOCUMENTS

| | | | | |
|---|---|---|---|---|
| JP | 2003-142441 | A | 5/2003 | |
| JP | 2005-255983 |   | 9/2005 | |
| JP | 2005255983  | * | 9/2005 | ............ B24B 37/00 |
| JP | 2009-55020  | A | 3/2009 | |
| JP | 2009-076716 |   | 4/2009 | |
| JP | 2010-258014 | A | 11/2010 | |
| JP | 2013-157516 | A | 8/2013 | |
| WO | WO 99/49997 | A1 | 10/1999 | |
| WO | WO 2014/087925 | A1 | 6/2014 | |

OTHER PUBLICATIONS

Notification of Reasons for Refusal dated Aug. 31, 2016 in Japanese Patent Application No. 2016-094397 (with English translation).
Decision of Refusal dated Nov. 9, 2016 in Japanese Patent Application No. 2016-094397 (with English translation).
Notification of Reasons for Refusal dated Jun. 29, 2016 in Japanese Patent Application No. 2016-094396 (with unedited computer generated English translation).
Notification of Reasons for Refusal dated Aug. 31, 2016 in Japanese Patent Application No. 2016-094396 (with unedited computer generated English translation).
Decision of Refusal dated Nov. 9, 2016 in Japanese Patent Application No. 2016-094396 (with unedited computer generated English translation).
U.S. Office Action dated Aug. 9, 2016, in co-pending U.S. Appl. No. 15/584,155.
Office Action dated Jan. 14, 2019, issued in U.S. Appl. No. 15/584,155.

* cited by examiner

SEMICONDUCTOR TREATMENT COMPOSITION AND TREATMENT METHOD

Japanese Patent Application No. 2016-094397 filed on May 10, 2016, Taiwanese Patent Application No. 105140526 filed on Dec. 8, 2016, Korean Patent Application No. 10-2017-0017333 filed on Feb. 8, 2017 and Chinese Patent Application No. 201710238028.2 filed on Apr. 12, 2017 are hereby incorporated by reference in their entirety.

BACKGROUND OF THE INVENTION

The present invention relates to a semiconductor treatment composition, and a treatment method that utilizes the semiconductor treatment composition.

Chemical mechanical polishing (CMP) that is used to produce a semiconductor device is a technique that causes the processing target (polishing target) and a polishing pad to come in sliding contact with each other while pressing the processing target against the polishing pad, and supplying a chemical mechanical polishing aqueous dispersion (hereinafter may be referred to as "CMP slurry") to the polishing pad to chemically and mechanically polish the processing target. The CMP slurry includes abrasive grains, and a chemical such as an etchant, and polishing waste (debris) is formed during CMP. A fatal device defect may occur if such polishing waste remains. Therefore, it is indispensable to perform a cleaning step after completion of CMP.

A metal wire material (e.g., copper and tungsten), an insulating material (e.g., silicon oxide), a barrier metal material (e.g., tantalum nitride and titanium nitride), and the like are exposed on the surface of the processing target that has been subjected to CMP. When such different materials are present on the polished surface, it is necessary to remove only contaminants from the polished surface so that damage such as corrosion does not occur. For example, JP-A-2010-258014 discloses technology that suppresses corrosion of the polished surface on which the wiring material and the barrier metal material are exposed, by utilizing an acidic semiconductor treatment composition. JP-A-2009-055020 and JP-A-2013-157516 disclose technology that treats the polished surface on which the wiring material and the barrier metal material (e.g., cobalt) are exposed, by utilizing a neutral to alkaline semiconductor treatment composition.

SUMMARY

However, the circuit structure has been further refined in recent years, and it has been desired to provide a treatment technique that can further reduce damage applied to a metal wire and the like that are included in the treatment target, and can still effectively remove contaminants from the surface of the treatment target.

For example, when subjecting a polishing target that includes a tungsten wire to CMP, a CMP slurry that includes iron nitrate and an additional oxidizing agent (e.g., hydrogen peroxide and potassium iodate) is used. Since an iron ion included in the CMP slurry is easily adsorbed on the surface of the polishing target, the polishing target surface is easily contaminated with iron. Iron can be removed by treating the polished surface using diluted hydrofluoric acid. In this case, however, the polished surface is easily etched and damaged. Therefore, it has been desired to provide a treatment technique that can reduce damage applied to a metal wire and the like included in the treatment target as much as possible, and can still effectively remove contaminants from the surface of the treatment target.

Several aspects of the invention may solve at least some of the above problems, and may provide a semiconductor treatment composition that can reduce damage applied to a metal wire and the like that are included in the treatment target, and can still effectively remove contaminants from the surface of the treatment target, and a treatment method that utilizes the semiconductor treatment composition.

The invention may be implemented as described below (see the following application examples).

Application Example 1

According to a first aspect of the invention, there is provided a concentrated semiconductor treatment composition comprising:

particles having a particle size of 0.1 to 0.3 micrometers in a number of $3 \times 10^1$ to $1.5 \times 10^3$ per mL.

Application Example 2

The concentrated semiconductor treatment composition according to Application Example 1 may be used in a 1 to 500-fold diluted state.

Application Example 3

According to a second aspect of the invention, there is provided a semiconductor treatment composition that is used without being diluted, the semiconductor treatment composition comprising:

particles having a particle size of 0.1 to 0.3 micrometers in a number of $3 \times 10^1$ to $1.5 \times 10^3$ per mL.

Application Example 4

The semiconductor treatment composition according to any one of Application Examples 1 to 3 may further include an organic acid.

Application Example 5

The semiconductor treatment composition according to any one of Application Examples 1 to 4 may further include a water-soluble polymer.

Application Example 6

According to a third aspect of the invention, there is provided a treatment method including:

treating a wiring board by using the semiconductor treatment composition according to any one of Application Examples 1 to 5, the wiring board containing a wiring material and a barrier metal material, the wiring material being copper or tungsten, and the barrier metal material being at least one material selected from the group consisting of tantalum, titanium, cobalt, ruthenium, manganese, and compounds thereof.

Application Example 7

According to a fourth aspect of the invention, there is provided a treatment method including:

treating a wiring board that contains tungsten as a wiring material by using the semiconductor treatment composition according to any one of Application Examples 1 to 5, after subjection the wiring board to chemical mechanical polishing by using a composition that contains iron ions and peroxides.

ADVANTAGEOUS EFFECTS OF INVENTION

Figure 1:
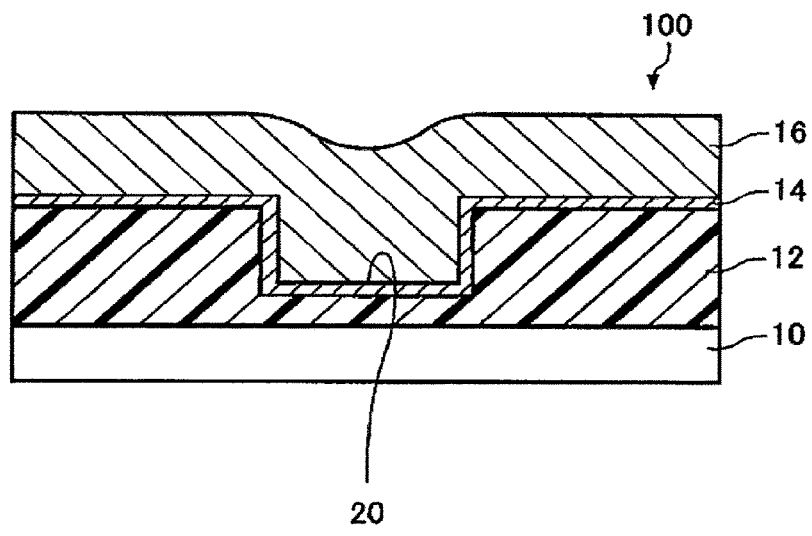
FIG. 1 is a cross-sectional view schematically illustrating a process that produces a wiring board that is used in connection with a treatment method according to one embodiment of the invention.

The semiconductor treatment composition according to one embodiment of the invention can reduce damage applied to a metal wire and the like included in the processing target, and can still effectively remove contaminants from the surface of the processing target.

DETAILED DESCRIPTION OF THE EMBODIMENT

The exemplary embodiments of the invention are described in detail below. Note that the invention is not limited to the exemplary embodiments described below. The invention includes various modifications that may be implemented without departing from the scope of the invention.

1. SEMICONDUCTOR TREATMENT COMPOSITION

A semiconductor treatment composition according to one embodiment of the invention includes particles having a particle size of 0.1 to 0.3 micrometers in a number of $3 \times 10^1$ to $1.5 \times 10^3$ per mL. The semiconductor treatment composition may be a concentrated-type semiconductor treatment composition that is used after being diluted with a liquid medium (e.g., purified water and organic solvent), or may be a non-dilution-type semiconductor treatment composition that is used without being diluted. The term "semiconductor treatment composition" used herein includes both the concentrated-type semiconductor treatment composition and the non-dilution-type semiconductor treatment composition unless otherwise specified.

The semiconductor treatment composition may be used as a treatment agent such as a cleaning agent for removing particles, metal impurities, and the like present on the surface of the treatment target (polishing target) after completion of CMP, a resist stripper for removing a resist from a semiconductor substrate that has been processed using a resist, and an etchant for shallowly etching the surface of a metal wire or the like to remove a surface contaminant. Note that the term "treatment agent" used herein includes a cleaning agent for cleaning a semiconductor surface, a resist stripper, an etchant, and the like. Each component included in the semiconductor treatment composition is described in detail below.

1.1. Particles Having Particle Size of 0.1 to 0.3 Micrometers

A semiconductor treatment composition according to one embodiment of the invention includes particles having a particle size of 0.1 to 0.3 micrometers (hereinafter may be referred to as "specific particles") in a number of $3 \times 10^1$ to $1.5 \times 10^3$ per mL. It is considered that, when the semiconductor treatment composition includes the specific particles in a number within a predetermined range, it is possible to effectively remove polishing waste that remains on the treatment target surface during the treatment step. If the semiconductor treatment composition includes the specific particles in a number more than the predetermined range, the specific particles may remain on the treatment target surface, and the electrical characteristics of the resulting semiconductor circuit (i.e., treatment target) may deteriorate, whereby a decrease in yield and the like may occur. If the semiconductor treatment composition includes the specific particles in a number less than the predetermined range, it may be difficult to effectively remove polishing waste that remains on the treatment target surface, and the flatness of the treatment target surface may deteriorate.

It is generally considered that a particle is foreign matter that should be removed as much as possible during a semiconductor device production process (see WO1999/049997, for example). However, it was found contrary to the above concept that it is possible to improve treatment performance without causing significant deterioration in semiconductor properties, by treating the treatment target surface by using a semiconductor treatment composition that includes particles having a particle size of 0.1 to 0.3 micrometers within a predetermined range.

It is preferable that the specific particles included in the semiconductor treatment composition according to one embodiment of the invention be metal particles or metal oxide particles, and more preferably insulating particles.

Examples of the metal particles and the metal oxide particles include iron, titanium, aluminum, zirconium, magnesium, oxides of these metals (e.g., iron oxide, titania, alumina, zirconia, and magnesia), silica, stainless steel (e.g., SUS201, SUS202, SUS301, SUS302, SUS303, SUS304, SUS305, SUS316, SUS317, SUS403, SUS405, SUS420, SUS430, and SUS630), and the like. Among these, iron oxide, stainless steel, titanium oxide, silica, and aluminum oxide are preferable, and silica is more preferable, since it is possible to effectively remove polishing waste that adheres to the treatment target surface without causing deterioration in the electrical characteristics of the semiconductor circuit.

It is preferable that the specific particles include specific particles that have a ratio (Rmax/Rmin) of the major axis (Rmax) to the minor axis (Rmin) of 1.3 or more, more preferably 1.4 to 3.0, and particularly more preferably 1.5 to 2.5 (hereinafter may be referred to as "specific shape particles"). When the semiconductor treatment composition includes the specific shape particles, it is possible to more effectively remove polishing waste that adheres to the treatment target surface. Since the specific shape particles have a concave-convex shape, the specific shape particles can trap and release components such as the water-soluble polymer, the organic acid, and the amine described later by means of the concave. It is considered that these components are released in the treatment step, and function effectively.

It is preferable that the specific particles include the specific shape particles in a ratio of 30 parts by mass or more, more preferably 40 parts by mass or more, and particularly more preferably 50 parts by mass or more, based on the total mass (=100 parts by mass) of the specific particles included in the semiconductor treatment composition.

The term "major axis (Rmax)" used herein in connection with a particle refers to the longest distance (dimension) that passes through the center of gravity of a particle image photographed using a transmission electron microscope, and connects the ends of the particle image. The term "minor axis (Rmin)" used herein in connection with a particle refers to the shortest distance (dimension) that passes through the center of gravity of a particle image photographed using a transmission electron microscope, and connects the ends of the particle image.

The particle size of the particles and the content of the particles in the semiconductor treatment composition may be measured using a particle size distribution analyzer that utilizes a laser diffraction method as the measurement principle. The term "particle size" used herein refers to a particle size (D50) at 50% in a cumulative particle size distribution measured using the particle size distribution analyzer. Examples of the laser diffraction particle size distribution analyzer include a HORIBA LA-300 series and a HORIBA LA-920 series (manufactured by Horiba, Ltd.); and the like. The particle size distribution analyzer that utilizes a laser diffraction method as the measurement principle can measure the particle size distribution of primary particles, and can also measure the particle size distribution of secondary particles that are formed by aggregation of the primary particles. Therefore, the particle size measured using the particle size distribution analyzer that utilizes a laser diffraction method as the measurement principle can be used as an index of the dispersion state of the particles included in the semiconductor treatment composition.

When subjecting a treatment target (polishing target) that includes tungsten as a wiring material to CMP, a CMP slurry that includes an iron ion and a peroxide (e.g., hydrogen peroxide and potassium iodate) is used. Since the iron ion included in the CMP slurry is easily adsorbed on the surface of the treatment target (polishing target), the polishing target surface is easily contaminated with iron. In this case, when the polishing target surface is cleaned using the semiconductor treatment composition according to one embodiment of the invention, it is considered that the specific particles effectively remove iron from the polishing target surface.

1.2. Additional Component

The semiconductor treatment composition according to one embodiment of the invention may include a water-soluble polymer, an organic acid, an amine, and the like in addition to a liquid medium (i.e., main component).

1.2.1. Water-Soluble Polymer

The semiconductor treatment composition according to one embodiment of the invention may include a water-soluble polymer. The water-soluble polymer adheres to the treatment target surface, and reduces corrosion. Therefore, corrosion of the treatment target surface can be reduced by adding the water-soluble polymer to the semiconductor treatment composition. Note that the term "water-soluble" used herein in connection with a substance means that 0.1 g or more of the substance is dissolved in 100 g water at 20° C. The term "water-soluble polymer" used herein refers to a water-soluble compound in which two or more repeating units are bonded linearly or in a mesh-like manner through a covalent bond.

Examples of the water-soluble polymer include, but are not limited to, polyacrylic acid, polymethacrylic acid, polymaleic acid, polyvinylsulfonic acid, polyallylsulfonic acid, polystyrenesulfonic acid, and salts thereof; a copolymer of a monomer such as styrene, alpha-methylstyrene, or 4-methylstyrene and an acid monomer such as (meth)acrylic acid or maleic acid, a polymer that includes a repeating unit including an aromatic hydrocarbon group obtained by condensing benzenesulfonic acid, naphthalenesulfonic acid, or the like using formalin, and salts thereof; a vinyl-based synthetic polymer such as polyvinyl alcohol, polyoxyethylene, polyvinylpyrrolidone, polyvinylpyridine, polyacrylamide, polyvinylformamide, polyethylenimine, polyvinyloxazoline, polyvinylimidazole, and polyallylamine; a modified natural polysaccharide such as hydroxyethyl cellulose, carboxymethyl cellulose, and modified starch; and the like. These water-soluble polymers may be used either alone or in combination.

The water-soluble polymer used in connection with one embodiment of the invention may be a homopolymer, or may be a copolymer obtained by copolymerizing two or more monomers. For example, a monomer that includes a carboxyl group, a monomer that includes a sulfonic acid group, a monomer that includes a hydroxyl group, a monomer that includes a polyethylene oxide chain, a monomer that includes an amino group, a monomer that includes a heterocyclic ring, and the like may be used as the monomers.

The weight average molecular weight (Mw) of the water-soluble polymer used in connection with one embodiment of the invention is preferably 1,000 to 1,500,000, and more preferably 3,000 to 1,200,000. Note that the term "weight average molecular weight" used herein refers to a polyethylene glycol-equivalent weight average molecular weight determined by gel permeation chromatography (GPC).

The content of the water-soluble polymer in the semiconductor treatment composition may be adjusted so that the semiconductor treatment composition has a viscosity at room temperature of 2 mPa·s or less. If the viscosity at room temperature of the semiconductor treatment composition exceeds 2 mPa·s, it may be difficult to stably supply the semiconductor treatment composition to the treatment target. Since the viscosity of the semiconductor treatment composition is substantially determined by the weight average molecular weight and the content of the water-soluble polymer, the content of the water-soluble polymer may be adjusted taking account of the balance therebetween.

The content of the water-soluble polymer in the semiconductor treatment composition may be appropriately changed taking account of a metal wire material (e.g., copper and tungsten), an insulating material (e.g., silicon oxide), a barrier metal material (e.g., tantalum nitride and titanium nitride), and the like that are exposed on the surface of the treatment target that has been subjected to CMP, and the composition of the CMP slurry.

The content of the water-soluble polymer in the semiconductor treatment composition may also be appropriately changed taking account of the degree of dilution with respect to the concentrated-type semiconductor treatment composition. The lower limit of the content of the water-soluble polymer in the semiconductor treatment composition is preferably 0.001 parts by mass or more, and more preferably 0.01 parts by mass or more, based on 100 parts by mass of a treatment agent prepared by diluting the concentrated-type semiconductor treatment composition, or based on 100 parts by mass of the non-dilution-type semiconductor treatment composition (treatment agent). The upper limit of the content of the water-soluble polymer in the semiconductor treatment composition is preferably 1 part by mass or less, and more preferably 0.1 parts by mass or less, based on 100 parts by mass of a treatment agent prepared by diluting the concentrated-type semiconductor treatment composition, or based on 100 parts by mass of the non-dilution-type semiconductor treatment composition (treatment agent). When the content of the water-soluble polymer is within the above range, it is possible to remove particles and metal impurities included in the CMP slurry from the wiring board while suppressing the occurrence of corrosion, and obtain a more excellently treated surface.

1.2.2. Organic Acid

The semiconductor treatment composition according to one embodiment of the invention may include an organic acid. It is preferable that the organic acid include one or more acidic groups (e.g., carboxy group and sulfo group). Note that the term "organic acid" used herein excludes the water-soluble polymer described above.

Specific examples of the organic acid include citric acid, maleic acid, malic acid, tartaric acid, oxalic acid, malonic acid, succinic acid, ethylenediaminetetraacetic acid, acrylic acid, methacrylic acid, benzoic acid, phenyllactic acid, hydroxyphenyllactic acid, phenylsuccinic acid, naphthalenesulfonic acid, salts thereof and the like. These organic acids may be used either alone or in combination.

An amino acid may also be used as the organic acid. Examples of the amino acid include a compound represented by the following general formula (1), and the like.

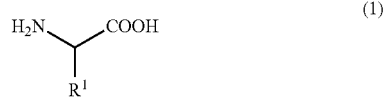

(1)

wherein $R^1$ is an atom or a group selected from the group consisting of a hydrogen atom, a hydrocarbon group having 1 to 10 carbon atoms, and an organic group having 1 to 20 carbon atoms that includes a hetero atom.

Examples of the hydrocarbon group having 1 to 10 carbon atoms that may be represented by $R^1$ in the general formula (1), include a saturated aliphatic hydrocarbon group having 1 to 10 carbon atoms, a saturated cyclic hydrocarbon group having 1 to 10 carbon atoms, an aromatic hydrocarbon group having 6 to 10 carbon atoms, and the like. Among these, a saturated aliphatic hydrocarbon group having 1 to 10 carbon atoms is preferable.

Examples of the organic group having 1 to 20 carbon atoms that includes a hetero atom that may be represented by $R^1$ in the general formula (1), include a hydrocarbon group having 1 to 20 carbon atoms that includes a carboxy group, a hydrocarbon group having 1 to 20 carbon atoms that includes a hydroxy group, a hydrocarbon group having 1 to 20 carbon atoms that includes an amino group, a hydrocarbon group having 1 to 20 carbon atoms that includes a mercapto group, an organic group having 1 to 20 carbon atoms that includes a heterocyclic ring, and the like. These groups may further include a hetero atom such as an oxygen atom, a sulfur atom, and a halogen atom, and may be substituted with an additional substituent.

Examples of the compound represented by the general formula (1) include alanine, arginine, asparagine, aspartic acid, cysteine, glutamine, glutamic acid, glycine, isoleucine, leucine, lysine, methionine, phenylalanine, serine, threonine, tyrosine, valine, tryptophan, histidine, 2-amino-3-aminopropanoic acid, and the like. These amino acids may be used either alone or in combination.

It is also preferable to use a compound represented by the following general formula (2) as the organic acid.

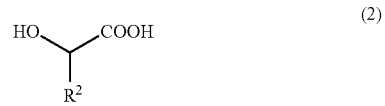

(2)

wherein $R^2$ is an organic group having 1 to 20 carbon atoms.

Examples of the organic group having 1 to 20 carbon atoms that is represented by $R^2$ in the general formula (2), include a saturated aliphatic hydrocarbon group having 6 to 20 carbon atoms, an unsaturated aliphatic hydrocarbon group having 6 to 20 carbon atoms, an organic group having 6 to 20 carbon atoms that includes a saturated cyclic hydrocarbon group, an organic group having 6 to 20 carbon atoms that includes an unsaturated cyclic hydrocarbon group, a hydrocarbon group having 1 to 20 carbon atoms that includes a carboxy group, a hydrocarbon group having 1 to 20 carbon atoms that includes a hydroxy group, a hydrocarbon group having 1 to 20 carbon atoms that includes an amino group, an organic group having 1 to 20 carbon atoms that includes a heterocyclic ring, and the like. Among these, an organic group having 6 to 20 carbon atoms that includes an unsaturated cyclic hydrocarbon group, and a hydrocarbon group having 1 to 20 carbon atoms that includes a carboxy group, are preferable, and an organic group having 6 to 20 carbon atoms that includes an aryl group, and a carboxymethyl group are particularly preferable. Note that the compound represented by the general formula (2) excludes the compound represented by the general formula (1).

Specific examples of the compound represented by the general formula (2) include hydroxyphenyllactic acid, hydroxymalonic acid, and the like. Among these, hydroxyphenyllactic acid is preferable. These compounds may be used either alone or in combination.

The content of the organic acid in the semiconductor treatment composition may be appropriately changed taking account of a metal wire material (e.g., copper and tungsten), an insulating material (e.g., silicon oxide), a barrier metal material (e.g., tantalum nitride and titanium nitride), and the like that are exposed on the surface of the treatment target that has been subjected to CMP, and the composition of the CMP slurry.

The content of the organic acid in the semiconductor treatment composition may also be appropriately changed taking account of the degree of dilution with respect to the concentrated-type semiconductor treatment composition. The lower limit of the content of the organic acid in the semiconductor treatment composition is preferably 0.0001 parts by mass or more, and more preferably 0.0005 parts by mass or more, based on 100 parts by mass of a treatment agent prepared by diluting the concentrated-type semiconductor treatment composition, or based on 100 parts by mass of the non-dilution-type semiconductor treatment composition (treatment agent). The upper limit of the content of the organic acid in the semiconductor treatment composition is preferably 1 part by mass or less, and more preferably 0.5 parts by mass or less, based on 100 parts by mass of a treatment agent prepared by diluting the concentrated-type semiconductor treatment composition, or based on 100 parts by mass of the non-dilution-type semiconductor treatment composition (treatment agent). When the content of the organic acid is within the above range, it is possible to effectively remove impurities that adhere to the surface of the wiring material. It is also possible to more effectively suppress a situation in which etching proceeds to an excessive extent, and obtain an excellently treated surface.

1.2.3. Amine

The semiconductor treatment composition according to one embodiment of the invention may include an amine (excluding an amino acid). It is considered that an amine functions as an etchant. It is considered that the addition of an amine makes it possible to etch and remove a metal oxide film (e.g., CuO layer, $Cu_2O$ layer, and $Cu(OH)_2$ layer) and an organic residue (e.g., BTA layer) on the wiring board in the treatment step that is performed after completion of CMP.

It is preferable that the amine be a water-soluble amine. The term "water-soluble" used herein in connection with an amine means that 0.1 g or more of the amine is dissolved in 100 g water at 20° C. Examples of the amine include an alkanolamine, a primary amine, a secondary amine, a tertiary amine, and the like.

Examples of the alkanolamine include monoethanolamine, diethanolamine, triethanolamine, N-methylethanolamine, N-methyl-N,N-diethanolamine, N,N-dimethylethanolamine, N,N-diethylethanolamine, N,N-dibutylethanolamine, N-(beta-aminoethyl)ethanolamine, N-ethylethanolamine, monopropanolamine, dipropanolamine, tripropanolamine, monoisopropanolamine, diisopropanolamine, triisopropanolamine, and the like. Examples of the primary amine include methylamine, ethylamine, propylamine, butylamine, pentylamine, 1,3-propanediamine, and the like. Examples of the secondary amine include piperidine, piperazine, and the like. Examples of the tertiary amine include trimethylamine, triethylamine, and the like. These amines may be used either alone or in combination.

Among these, monoethanolamine and monoisopropanolamine are preferable, and monoethanolamine is more preferable, since it is possible to effectively etch a metal oxide film and an organic residue on the wiring board.

The content of the amine in the semiconductor treatment composition may be appropriately changed taking account of a metal wire material (e.g., copper and tungsten), an insulating material (e.g., silicon oxide), a barrier metal material (e.g., tantalum nitride and titanium nitride), and the like that are exposed on the surface of the treatment target that has been subjected to CMP, and the composition of the CMP slurry.

The content of the amine in the semiconductor treatment composition may also be appropriately changed taking account of the degree of dilution with respect to the concentrated-type semiconductor treatment composition. The lower limit of the content of the amine in the semiconductor treatment composition is preferably 0.0001 parts by mass or more, and more preferably 0.0005 parts by mass or more, based on 100 parts by mass of a treatment agent prepared by diluting the concentrated-type semiconductor treatment composition, or based on 100 parts by mass of the non-dilution-type semiconductor treatment composition (treatment agent). The upper limit of the content of the amine in the semiconductor treatment composition is preferably 1 part by mass or less, and more preferably 0.5 parts by mass or less, based on 100 parts by mass of a treatment agent prepared by diluting the concentrated-type semiconductor treatment composition, or based on 100 parts by mass of the non-dilution-type semiconductor treatment composition (treatment agent). When the content of the amine is within the above range, it is possible to effectively etch and remove a metal oxide film and an organic residue on the wiring board in the treatment step that is performed after completion of CMP.

1.2.4. Liquid Medium

The semiconductor treatment composition according to one embodiment of the invention is a liquid that includes a liquid medium as the main component. The liquid medium may be appropriately selected taking account of the intended use (e.g., cleaning, etching, and resist removal) of the treatment target. For example, when the semiconductor treatment composition is used as a cleaning agent, it is preferable that the liquid medium include water as the main component, and function as a solvent. Examples of such a liquid medium include water, a mixed medium that includes water and an alcohol, a mixed medium that includes water and a water-miscible organic solvent, and the like. It is preferable to use water or a mixed medium that includes water and an alcohol. It is more preferable to use water.

For example, when the semiconductor treatment composition is used as an etchant or a resist stripper, it is preferable that the liquid medium include an organic solvent as the main component, and function as a solvent. Examples of the organic solvent include a known organic solvent that can be used for a semiconductor treatment, such as a polar solvent, e.g., a ketone-based solvent, an ester-based solvent, an ether-based solvent, and an amide-based solvent, and a hydrocarbon-based solvent.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, propylene carbonate, gamma-butyrolactone, and the like.

Examples of the ester-based solvent include a linear ester-based solvent such as methyl acetate, butyl acetate, ethyl acetate, isopropyl acetate, pentyl acetate, isopentyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 3-methoxypropionate, ethyl 3-methoxypropionate, ethyl 3-ethoxypropionate, and propyl 3-methoxypropionate; a cyclic ester-based solvent such as a lactone (e.g., gamma-butyrolactone); and the like.

Examples of the ether-based solvent include a glycol ether-based solvent such as ethylene glycol dibutyl ether, propylene glycol dimethyl ether, propylene glycol diethyl ether, diethylene glycol dimethyl ether, diethylene glycol diethyl ether, and diethylene glycol dibutyl ether, diisopentyl ether, diisobutyl ether, dioxane, tetrahydrofuran, anisole, perfluoro-2-butyltetrahydrofuran, perfluorotetrahydrofuran, 1,4-dioxane, and the like.

Examples of the amide-based solvent include N-methyl-2-pyrrolidone, N,N-dimethylacetamide, N,N-dimethylformamide, hexamethylphosphoric triamide, 1,3-dimethyl-2-imidazolidinone, and the like. Examples of a further polar solvent include dimethyl sulfoxide and the like.

Examples of the hydrocarbon-based solvent include an aliphatic hydrocarbon-based solvent such as pentane, hexane, octane, decane, 2,2,4-trimethylpentane, 2,2,3-trimethylhexane, perfluorohexane, perfluoroheptane, limonene, and pinene; and an aromatic hydrocarbon-based solvent such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene, and dipropylbenzene.

1.2.5. Further Additional Component

The semiconductor treatment composition according to one embodiment of the invention may appropriately (optionally) further include a pH-adjusting agent, a surfactant, and the like.

<pH-Adjusting Agent>

When the semiconductor treatment composition is used to treat the treatment target surface that includes copper as a wiring material, the lower limit of the pH of the semiconductor treatment composition is preferably 9 or more, and more preferably 10 or more, and the upper limit of the pH of the semiconductor treatment composition is preferably 14 or less. When the semiconductor treatment composition is used to treat the treatment target surface that includes tungsten as a wiring material, the upper limit of the pH of the semiconductor treatment composition is preferably 7 or less, and more preferably 6 or less, and the lower limit of the pH of the semiconductor treatment composition is preferably 2 or more.

When the pH of the semiconductor treatment composition cannot be adjusted to the desired value by adding the organic acid and the amine mentioned above, a pH-adjusting agent may be added to the semiconductor treatment composition in order to adjust the pH of the semiconductor treatment composition within the above range. Examples of the pH-adjusting agent include an alkali metal hydroxide such as sodium hydroxide, potassium hydroxide, rubidium hydroxide, and cesium hydroxide, an organic ammonium salt such as tetramethylammonium hydroxide, and a basic compound such as ammonia. These pH-adjusting agents may be used either alone or in combination.

<Surfactant>

A known component may be used as the surfactant. It is preferable to use a nonionic surfactant or an anionic surfactant as the surfactant. The addition of the surfactant may improve the effect of removing particles and metal impurities included in the CMP slurry from the wiring board, and a more excellently treated surface may be obtained.

Examples of the nonionic surfactant include a polyoxyethylene alkyl ether such as polyoxyethylene lauryl ether, polyoxyethylene cetyl ether, polyoxyethylene stearyl ether, and polyoxyethylene oleyl ether; a polyoxyethylene aryl ether such as polyoxyethylene octyl phenyl ether and polyoxyethylene nonyl phenyl ether; a sorbitan fatty acid ester such as sorbitan monolaurate, sorbitan monopalmitate, and sorbitan monostearate; a polyoxyethylene sorbitan fatty acid ester such as polyoxyethylene sorbitan monolaurate, polyoxyethylene sorbitan monopalmitate, and polyoxyethylene sorbitan monostearate; and the like. These nonionic surfactants may be used either alone or in combination.

Examples of the anionic surfactant include an alkylbenzenesulfonic acid such as dodecylbenzenesulfonic acid; an alkylnaphthalenesulfonic acid; an alkyl sulfate such as lauryl sulfate; a sulfuric acid ester of a polyoxyethylene alkyl ether, such as polyoxyethylene lauryl sulfate; a naphthalenesulfonic acid condensate; an alkyliminodicarboxylic acid; lignin sulfonic acid; and the like. These anionic surfactants may be used in the form of a salt. Examples of the counter cation include a sodium ion, a potassium ion, an ammonium ion, and the like. Among these, an ammonium ion is preferable from the viewpoint of preventing an excessive increase in potassium or sodium content.

When subjecting a treatment target (polishing target) that includes tungsten as a wiring material to CMP, a CMP slurry that includes an iron ion and a peroxide (e.g., hydrogen peroxide and potassium iodate) is used. Since the iron ion included in the CMP slurry is easily adsorbed on the surface of the treatment target (polishing target), the polishing target surface is easily contaminated with iron. In this case, since the iron ion is positively charged, it may be possible to effectively remove iron from the polished surface by adding the anionic surfactant to the semiconductor treatment composition.

The content of the surfactant in the semiconductor treatment composition may be appropriately changed taking account of a metal wire material (e.g., copper and tungsten), an insulating material (e.g., silicon oxide), a barrier metal material (e.g., tantalum nitride and titanium nitride), and the like that are exposed on the surface of the treatment target that has been subjected to CMP, and the composition of the CMP slurry.

The content of the surfactant in the semiconductor treatment composition may also be appropriately changed taking account of the degree of dilution with respect to the concentrated-type semiconductor treatment composition. The content of the surfactant in the semiconductor treatment composition is preferably 0.001 to 1 part by mass based on 100 parts by mass of a treatment agent prepared by diluting the concentrated-type semiconductor treatment composition, or based on 100 parts by mass of the non-dilution-type semiconductor treatment composition (treatment agent). When the content of the surfactant is within the above range, it is possible to effectively remove an organic residue in the treatment step that is performed after completion of CMP while reducing corrosion of the treatment target.

1.3. Method for Preparing Semiconductor Treatment Composition

The semiconductor treatment composition may be prepared using a known method (arbitrary method). The semiconductor treatment composition may be prepared by dissolving each component in the liquid medium (e.g., water or organic solvent), and filtering the solution. The components may be mixed in an arbitrary order using an arbitrary method.

When preparing the semiconductor treatment composition according to one embodiment of the invention, it is preferable to control the amount of particles by filtering the solution using a depth-type filter or a pleat-type filter. The term "depth-type filter" used herein refers to a high-performance filter that is also referred to as "depth filtration filter"

or "volume filtration filter". The depth-type filter may have a stacked structure that is formed by stacking filtration membranes in which a number of pores are formed, or may be formed by rolling up a fiber bundle, for example. Specific examples of the depth-type filter include Profile II, Nexis NXA, Nexis NXT, Poly-Fine XLD, and Ultipleat Profile (manufactured by Pall Corporation); Depth Cartridge Filter and Wound Cartridge Filter (manufactured by Advantec Co., Ltd.); CP Filter and BM Filter (manufactured by Chisso Corporation); SLOPE-PURE, DIA, and MICRO-CILIA (manufactured by Roki Techno Co., Ltd.); and the like.

Examples of the pleat-type filter include a tubular high-performance filter that is obtained by pleating a microfiltration membrane sheet formed of a nonwoven fabric, filter paper, metal mesh, or the like, forming the microfiltration membrane sheet to have a tubular shape, liquid-tightly sealing the joint of the sheet, and liquid-tightly sealing each end of the tubular sheet. Specific examples of the pleat-type filter include HDC II and Poly-Fine II (manufactured by Pall Corporation); PP Pleated Cartridge Filter (manufactured by Advantec Co., Ltd.); POROUSFINE (manufactured by Chisso Corporation); CERTAIN-PORE and MICRO-PURE (manufactured by Roki Techno Co., Ltd.); and the like.

It is preferable to use a filter having a nominal filtration rating of 0.01 to 20 micrometers. When the nominal filtration rating is within the above range, it is possible to efficiently obtain a filtrate in which the number (per mL) of particles having a particle size of 20 micrometers or more measured using a particle counter is 0. Moreover, since the number of large particles trapped by the filter is minimized, the service life of the filter increases.

2. TREATMENT AGENT

The term "treatment agent" used herein refers to a liquid agent that is prepared by diluting the concentrated-type semiconductor treatment composition with a liquid medium, or prepared using the non-dilution-type semiconductor treatment composition, and is used to treat the treatment target surface. The treatment agent is prepared by appropriately diluting the concentrated-type semiconductor treatment composition with a liquid medium, or the non-dilution-type semiconductor treatment composition is utilized directly as the treatment agent, and the treatment agent is used as a cleaning agent, an etchant, or a resist stripper.

The liquid medium that is used to dilute the concentrated-type semiconductor treatment composition is the same as the liquid medium that is included in the semiconductor treatment composition, and may be appropriately selected from the liquid media mentioned above taking account of the type of treatment agent.

The concentrated-type semiconductor treatment composition may be diluted with the liquid medium using a method that mixes the concentrated-type semiconductor treatment composition supplied from a pipe that supplies the concentrated-type semiconductor treatment composition, and the liquid medium supplied from a pipe that supplies the liquid medium, and supplies the mixture (treatment agent) to the treatment target surface. The concentrated-type semiconductor treatment composition and the liquid medium may be mixed using an ordinary method such as a method that causes the concentrated-type semiconductor treatment composition and the liquid medium to collide (be mixed) with each other through a narrow passage in a state in which pressure is applied; a method that causes the flow of the liquid to be repeatedly divided and joined by charging the pipe with a packing material such as glass tubes; and a method that provides a power-driven blade inside the pipe.

The concentrated-type semiconductor treatment composition may be diluted with the liquid medium using a method that provides a pipe that supplies the concentrated-type semiconductor treatment composition and a pipe that supplies the liquid medium so as to be independent of each other, and supplies a predetermined amount of liquid to the treatment target surface from each pipe so that the concentrated-type semiconductor treatment composition and the liquid medium are mixed on the treatment target surface. The concentrated-type semiconductor treatment composition may also be diluted with the liquid medium using a method that charges a container with a predetermined amount of concentrated-type semiconductor treatment composition and a predetermined amount of liquid medium, mixes the concentrated-type semiconductor treatment composition and the liquid medium, and supplies the mixture (treatment agent) to the treatment target surface.

Regarding the dilution ratio employed when diluting the concentrated-type semiconductor treatment composition with the liquid medium, it is preferable to dilute 1 part by mass of the concentrated-type semiconductor treatment composition with the liquid medium so that 1 to 500 parts by mass (1 to 500-fold amount), more preferably 20 to 500 parts by mass (20 to 500-fold amount), and particularly preferably 30 to 300 parts by mass (30 to 300-fold amount), of a mixture is obtained. Note that it is preferable to dilute the concentrated-type semiconductor treatment composition with the same liquid medium as that included in the concentrated-type semiconductor treatment composition. When the semiconductor treatment composition is concentrated, it is possible to transport and store the semiconductor treatment composition using a small container as compared with the case where the treatment agent prepared using the semiconductor treatment composition is transported and stored. This makes it possible to reduce the transport-storage cost. Since the purification volume is reduced as compared with the case where the treatment agent is purified by filtration or the like, it is possible to reduce the purification time, and implement mass production.

3. TREATMENT METHOD

A treatment method according to one embodiment of the invention includes treating a wiring board using the semiconductor treatment composition (i.e., treatment agent (e.g., cleaning agent, etchant, or resist stripper)), the wiring board including a wiring material and a barrier metal material, the wiring material being copper or tungsten, and the barrier metal material being at least one material selected from the group consisting of tantalum, titanium, cobalt, ruthenium, manganese, and compounds thereof. An example of the treatment method is described in detail below with reference to the drawings.

<Production of Wiring Board>

FIG. 1 is a cross-sectional view schematically illustrating a process that produces the wiring board that is used in connection with the treatment method. The wiring board is produced as described below.

FIG. 1 is a cross-sectional view schematically illustrating the polishing target that is to be subjected to CMP. As illustrated in FIG. 1, a polishing target 100 includes a substrate 10. The substrate 10 may include a silicon substrate, and a silicon oxide film that is formed on the silicon substrate, for example. A functional device such as a transistor (not illustrated in FIG. 1) may be formed on the substrate 10.

The polishing target 100 includes an insulating film 12 which is formed on the substrate 10 and in which a wiring recess 20 is formed, a barrier metal film 14 that is formed to cover the surface of the insulating film 12 and the bottom and the inner wall surface of the wiring recess 20, and a metal film 16 that is formed on the barrier metal film 14 so that the wiring recess 20 is filled with the metal film 16, the insulating film 12, the barrier metal film 14, and the metal film 16 being sequentially stacked.

The insulating film 12 may be a silicon oxide film formed by a vacuum process (e.g., a plasma enhanced-TEOS film (PETEOS film), a high-density plasma enhanced-TEOS film (HDP film), or a silicon oxide film obtained by thermal chemical vapor deposition), an insulating film referred to as fluorine-doped silicate glass (FSG), a borophosphosilicate film (BPSG film), an insulating film referred to as silicon oxynitride (SiON), silicon nitride, or the like.

Examples of a metal that is used to form the barrier metal film 14 include tantalum, titanium, cobalt, ruthenium, manganese, compounds thereof, and the like. The barrier metal film 14 is normally formed using one material among these materials. Note that the barrier metal film 14 may be formed using two or more materials (e.g., tantalum and tantalum nitride) among these materials.

As illustrated in FIG. 1, the wiring recess 20 must be completely filled with the metal film 16. Therefore, a metal film having a thickness of 10,000 to 15,000 angstroms is normally deposited by chemical vapor deposition or electroplating. Examples of a material that is used to form the metal film 16 include copper and tungsten. When using copper, copper having high purity, or a copper alloy may be used. The copper content in the copper alloy is preferably 95 mass % or more.

The metal film 16 included in the polishing target 100 illustrated in FIG. 1 is subjected to CMP (polished) at a high speed in an area other than the area situated within the wiring recess 20 until the barrier metal film 14 is exposed (first polishing step). The exposed barrier metal film 14 is subjected to CMP (polished) (second polishing step). A wiring board 200 illustrated in FIG. 2 is thus obtained.

<Treatment of Wiring Board>

Figure 2:
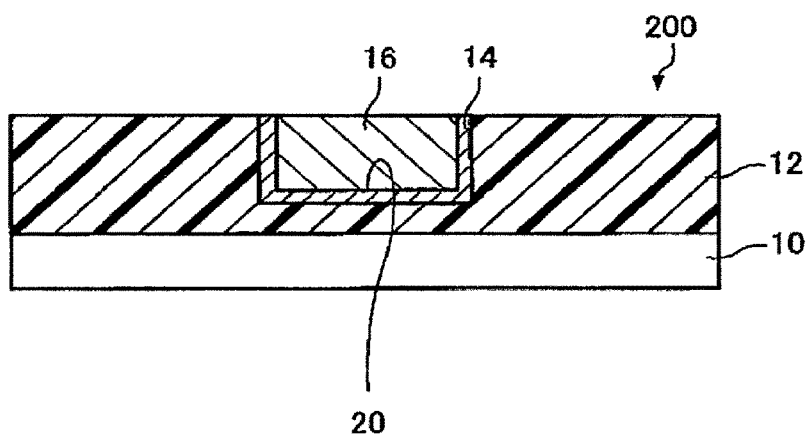
FIG. 2 is a cross-sectional view schematically illustrating a process that produces a wiring board that is used in connection with a treatment method according to one embodiment of the invention.

The surface (treatment target surface) of the wiring board 200 illustrated in FIG. 2 is treated using the treatment agent (cleaning agent). The treatment method can suppress corrosion of the wiring material and the barrier metal material, and efficiently remove an oxide film and an organic residue on the wiring board when treating the wiring board which has been subjected to CMP, and on which the wiring material and the barrier metal material are present.

It is very effective to perform the treatment method when the wiring board includes tungsten as the wiring material, and has been subjected to CMP using a composition (Fenton's reagent) that includes an iron ion and a peroxide (see JP-A-10-265766). When subjecting the polishing target that includes tungsten as the wiring material to CMP, a CMP slurry that includes an iron ion and a peroxide (e.g., hydrogen peroxide and potassium iodate) is used. Since the iron ion included in the CMP slurry is easily adsorbed on the surface of the treatment target (polishing target), the polishing target surface is easily contaminated with iron. Iron can be removed by treating the polished surface using diluted hydrofluoric acid. In this case, however, the polished surface is easily etched and damaged. On the other hand, the semiconductor treatment composition includes the specific particles in a predetermined ratio, and it is considered that the specific particles effectively remove iron from the surface of the treatment target (polishing target).

The treatment method is implemented by bringing the cleaning agent into direct contact with the wiring board 200, for example. The cleaning agent may be brought into direct contact with the wiring board 200 using a dipping method that fills a cleaning tank with the cleaning agent, and immerses the wiring board in the cleaning agent; a spin method that rotates the wiring board at a high speed while supplying the cleaning agent to the wiring board from a nozzle; a spray method that sprays the cleaning agent onto the wiring board; or the like. Examples of a device used to implement such a method include a batch-type cleaning device that simultaneously cleans a plurality of wiring boards placed in a cassette, a single-wafer cleaning device that cleans a single wiring board that is held by a holder, and the like.

When implementing the treatment method, the cleaning agent is normally used at room temperature. Note that the cleaning agent may be heated as long as the performance of the cleaning agent is not impaired. For example, the cleaning agent may be heated to about 40° C. to about 70° C.

It is also preferable to use a treatment method that utilizes a physical force in combination with the method that brings the cleaning agent into direct contact with the wiring board 200. This makes it possible to more effectively remove contamination due to particles that adhere to the wiring board 200, and reduce the treatment time. Examples of the treatment method that utilizes a physical force include a scrubbing cleaning method that utilizes a cleaning brush, and an ultrasonic cleaning method.

A cleaning step that utilizes ultrapure water or purified water may be performed before and/or after the cleaning step that utilizes the treatment method.

4. EXAMPLES

The invention is further described below by way of examples. Note that the invention is not limited to the following examples. The units "parts" and "%" used in connection with the examples respectively refer to "parts by mass" and "mass %" unless otherwise indicated.

4.1. Example 1

4.1.1. Preparation of Semiconductor Treatment Composition (Concentrated-Type Semiconductor Treatment Composition)

A polyethylene container was charged with each component listed in Table 1 in the ratio listed in Table 1. After the addition of a proper quantity of ion-exchanged water, the mixture was stirred for 15 minutes. Ion-exchanged water, potassium hydroxide, and sodium hydroxide were optionally added to the mixture so that the total amount of the components was 100 parts by mass to prepare a composition having the pH, the K content, and the Na content listed in Table 1.

Figure 3:
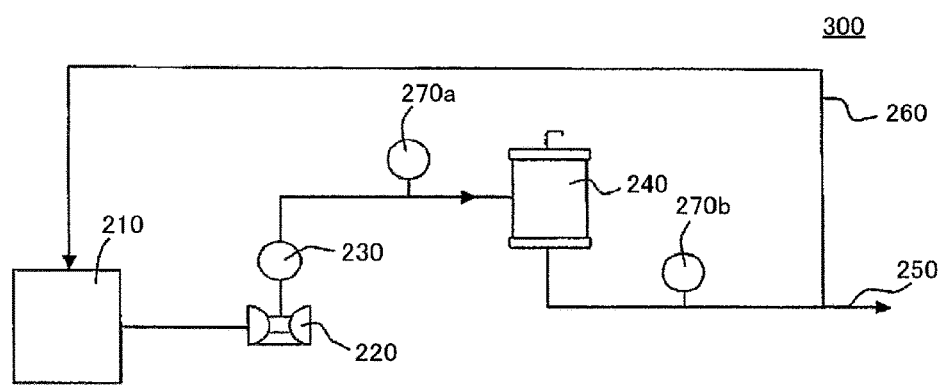
FIG. 3 schematically illustrates the configuration of the filtration device used in connection with the examples.

After the addition of 0.01 parts by mass of colloidal silica ("PL-1" manufactured by Fuso Chemical Co., Ltd., primary particle size: 15 nm) to 100 parts by mass of the composition, the mixture was filtered using the filtration device 300 illustrated in FIG. 3 (filtration step). The filtration device 300 illustrated in FIG. 3 includes a supply tank 210 that stores and supplies the composition from which foreign matter has not been removed, a constant volume pump 220 that discharges the composition (from which foreign matter has not been removed) at a constant flow rate, a filter 240 that includes a cartridge filter (not illustrated in FIG. 3) and a housing that holds (is fitted with) the cartridge filter, a pulsation protector 230 that is situated between the constant volume pump 220 and the filter 240, a first manometer 270a that is disposed between the pulsation protector 230 and the filter 240, and a second manometer 270b that is disposed on the downstream side of the filter 240. The filtration device 300 also includes a return conduit 260 that returns the semiconductor treatment composition from the filter 240 to the supply tank 210, and a discharge conduit 250 that discharges the semiconductor treatment composition that has been filtered through the filter 240.

In Example 1, a filter in which a membrane-type cartridge filter "WATER-FINE" (manufactured by Pall Corporation, nominal filtration rating: 0.05 micrometers, length: 10 inches) was provided in a housing, was used as the filter 240. An air-driven diaphragm pump was used as the constant volume pump 220. The differential pressure across the filter was set to 0.2 to 0.3 MPaG, and the flow rate of the composition was set as listed in Table 1.

The composition was sampled on a timely basis, and filtration was stopped when the number of particles having a particle size of 0.1 to 0.3 micrometers included in the composition had reached the value (concentration) listed in Table 1 to obtain a semiconductor treatment composition (concentrated-type semiconductor treatment composition) of Example 1. Note that the number of particles per mL of the composition was measured as described below.

A liquid-borne particle sensor "KS-42AF" (manufactured by RION Co., Ltd.) was used as a particle counter. Blank measurement was repeated using ultrapure water until the number of particles measured became "30 per mL (0.1 micrometers)" (i.e., the number of particles having a particle size of more than 0.1 micrometers was 30 or less per mL). 100 mL of the concentrated-type semiconductor treatment composition (sample) was provided, and placed in a syringe sampler "KZ-31W". The number of particles having a particle size of 0.1 to 0.3 micrometers per mL of the sample was measured twice using the liquid-borne particle sensor, and the average value thereof was calculated. The average value was taken as the number of particles having a particle size of 0.1 to 0.3 micrometers per mL of the semiconductor treatment composition.

4.1.2. Wiring Board Treatment Test
(1) Chemical Mechanical Polishing Step

A substrate provided with a copper wire pattern (i.e., a test substrate obtained by stacking a PETEOS film on an 8-inch silicon substrate to a thickness of 5,000 angstroms, forming a pattern using a mask ("SEMATECH 854"), and sequentially stacking a cobalt film (thickness: 250 angstroms), a copper seed film (thickness: 1,000 angstroms), and a copper-plated film (thickness: 10,000 angstroms) thereon) was subjected to two-step chemical mechanical polishing under the following conditions using a chemical mechanical polishing device "EPO112" (manufactured by EBARA Corporation). Note that the copper seed film and the copper-plated film were subjected to first-step chemical mechanical polishing until the cobalt film was exposed. The cobalt film, the copper seed film, and the copper-plated film were subjected to second-step chemical mechanical polishing until the PETEOS film was exposed.

<First-Step Chemical Mechanical Polishing>
Chemical mechanical polishing aqueous dispersion: "CMS7501/CMS7552" manufactured by JSR Corporation
Polishing pad: "IC1000/SUBA400" manufactured by Rodel Nitta
Platen rotational speed: 70 rpm
Head rotational speed: 71 rpm
Head load: 50 g/cm$^2$
Chemical mechanical polishing aqueous dispersion supply rate: 200 mL/min
Polishing time: 150 sec <Second-Step Chemical Mechanical Polishing>
Chemical mechanical polishing aqueous dispersion: "CMS8501/CMS8552" manufactured by JSR Corporation
Polishing pad: "IC1000/SUBA400" manufactured by Rodel Nitta
Platen rotational speed: 70 rpm
Head rotational speed: 71 rpm
Head load: 250 g/cm$^2$
Chemical mechanical polishing aqueous dispersion supply rate: 200 mL/min
Polishing time: 60 seconds (2) Treatment Step The semiconductor treatment composition obtained as described above was diluted with ultrapure water (number of particles having a particle size of 0.3 micrometers or more: 10 or less per mL, pH: 6.5) in the dilution ratio listed in Table 1 to prepare a treatment agent (cleaning agent), and the surface of the substrate that had been polished was treated (cleaned) on the platen under the following conditions. A brush scrubbing treatment (cleaning) was then performed.

<Treatment (Cleaning) on Platen>
Treatment agent: treatment agent (cleaning agent) prepared as described above
Head rotational speed: 70 rpm
Head load: 100 g/cm$^2$
Platen rotational speed: 71 rpm
Treatment agent supply rate: 300 mL/min
Treatment time: 30 sec <Brush Scrubbing Treatment (Cleaning)>
Treatment agent: treatment agent (cleaning agent) prepared as described above
Upper brush rotational speed: 100 rpm
Lower brush rotational speed: 100 rpm
Substrate rotational speed: 100 rpm
Treatment agent supply rate: 300 mL/min
Treatment time: 30 sec 4.1.3. Evaluation Tests
<Corrosion Evaluation>

The surface of the substrate that had been treated as described above was observed using a scanning electron microscope ("S-4800" manufactured by Hitachi High-Technologies Corporation) (magnification: 120,000) with respect to the copper wire (test pattern, 0.175 micrometers) to evaluate the extent of corrosion. The results are listed in Table 1. The following evaluation standard was used.

(Evaluation Standard)

A case where the number of copper wires (among ten copper wires) for which corrosion was observed was 3 or less, and no slit was observed between the copper wire and the barrier metal, was evaluated as "Very good", a case where the number of copper wires (among ten copper wires) for which corrosion was observed was more than 3 and 5 or less, and no slit was observed between the copper wire and the barrier metal, was evaluated as "Good" (acceptable), and a case where the number of copper wires (among ten copper wires) for which corrosion was observed was more than 5, or a slit was observed between the copper wire and the barrier metal, was evaluated as "Bad" (unacceptable).

<Cleaning (Defect) Evaluation>

The surface of the substrate that had been treated as described above was observed using a wafer defect inspection device ("KLA2351" manufactured by KLA-Tencor) to measure the number of defects (that had occurred over the entire surface of the substrate). The results are listed in Table 1. The following evaluation standard was used.

(Evaluation Standard)

A case where the number of defects that had occurred over the entire surface of the substrate was 250 or less was evaluated as "Very good", a case where the number of defects that had occurred over the entire surface of the substrate was more than 250 and 500 or less was evaluated as "Good" (acceptable), and a case where the number of defects that had occurred over the entire surface of the substrate was more than 500 was evaluated as "Bad" (unacceptable).

<Reliability Evaluation>

One thousand substrates (test substrates on which a copper film was stacked to a thickness of 5,000 angstroms) that had been subjected to second-step chemical mechanical polishing as described above, were subjected to the brush scrubbing cleaning (running treatment) using the treatment agent (cleaning agent) obtained as described above. Each substrate was then subjected to the defect inspection process, and a case where the number of defects that had occurred over the entire surface of the substrate was more than 250 was evaluated as "Bad". The number of substrates (among the one thousand substrates) that had been evaluated as "Bad" was counted to evaluate the reliability of the treatment agent (cleaning agent). The results are listed in Table 1. The following evaluation standard was used.

(Evaluation Standard)

A case where the number of substrates (among the one thousand substrates) that were evaluated as "Bad" was 50 or less was evaluated as "Very good", a case where the number of substrates (among the one thousand substrates) that were evaluated as "Bad" was more than 50 and 100 or less was evaluated as "Good" (acceptable), and a case where the number of substrates (among the one thousand substrates) that were evaluated as "Bad" was more than 100 was evaluated as "Bad" (unacceptable).

4.2. Examples 2 to 26 and Comparative Examples 1 to 9

A semiconductor treatment composition (concentrated-type semiconductor treatment composition) was prepared in the same manner as in Example 1, except that the composition was changed as listed in Table 1 or 2, and a treatment agent (cleaning agent) was prepared in the same manner as in Example 1, except that the composition was changed as listed in Table 1 or 2. The wiring board treatment test and the evaluation tests were performed in the same manner as in Example 1.

4.3. Example 27

4.3.1. Preparation of Semiconductor Treatment Composition

A semiconductor treatment composition (concentrated-type semiconductor treatment composition) was prepared in the same manner as in Example 1, except that the composition was changed as listed in Table 3, and the pH, the K content, and the Na content were adjusted as listed in Table 3 using potassium hydroxide and sodium hydroxide, as required.

4.3.2. Wiring Board Cleaning Test (1) Chemical Mechanical Polishing Step

A substrate provided with a copper wire pattern (i.e., a test substrate obtained by stacking a PETEOS film on an 8-inch silicon substrate to a thickness of 5,000 angstroms, forming a pattern using a mask ("SEMATECH 854"), and sequentially stacking a cobalt film (thickness: 250 angstroms), a tungsten seed film (thickness: 1,000 angstroms), and a tungsten-plated film (thickness: 10,000 angstroms) thereon) was subjected to single-step chemical mechanical polishing under the following conditions using a chemical mechanical polishing device "EPO112" (manufactured by EBARA Corporation).

<Polishing Conditions>

Chemical mechanical polishing aqueous dispersion: "W2000" (slurry including an iron ion and hydrogen peroxide) manufactured by Cabot Polishing pad: "IC1000/SUBA400" manufactured by Rodel Nitta Platen rotational speed: 70 rpm Head rotational speed: 71 rpm Head load: 50 g/cm$^2$ Chemical mechanical polishing aqueous dispersion supply rate: 200 mL/min Polishing time: 150 sec (2) Treatment Step The semiconductor treatment composition (concentrated-type semiconductor treatment composition) obtained as described above was diluted with ultrapure water (number of particles having a particle size of 0.3 micrometers or more: 10 or less per mL, pH: 6.5) in the dilution ratio listed in Table 3 to prepare a treatment agent (cleaning agent), and the surface of the substrate that had been polished was treated (cleaned) on the platen under the following conditions. A brush scrubbing cleaning was then performed.

<Treatment (Cleaning) on Platen>

Treatment agent: treatment agent (cleaning agent) prepared as described above

Head rotational speed: 71 rpm

Head load: 100 g/cm$^2$

Platen rotational speed: 70 rpm

Treatment agent supply rate: 300 mL/min

Treatment time: 30 sec

<Brush Scrubbing Cleaning>

Treatment agent: treatment agent (cleaning agent) prepared as described above

Upper brush rotational speed: 100 rpm

Lower brush rotational speed: 100 rpm

Substrate rotational speed: 100 rpm

Treatment agent supply rate: 300 mL/min

Treatment time: 30 sec 4.3.3. Evaluation Tests

<Corrosion Evaluation>

The surface of the substrate that had been treated as described above was evaluated in the same manner as in Example 1. The results are listed in Table 3.

<Cleaning (Defect) Evaluation>

The surface of the substrate that had been treated as described above was evaluated in the same manner as in Example 1. The results are listed in Table 3.

<Reliability Evaluation>

One thousand substrates (test substrates on which a tungsten film was stacked to a thickness of 3,000 angstroms) that had been subjected to chemical mechanical polishing as described above, were subjected to the brush scrubbing cleaning (running cleaning) using the treatment agent (cleaning agent) obtained as described above. Each substrate was then subjected to the defect inspection process, and a case where the number of defects that had occurred over the entire surface of the substrate was more than 250 was evaluated as "Bad". The number of substrates (among the one thousand substrates) that had been evaluated as "Bad" was counted to evaluate the reliability of the treatment agent (cleaning agent). The results are listed in Table 3. The following evaluation standard was used.

(Evaluation Standard)

A case where the number of substrates (among the one thousand substrates) that were evaluated as "Bad" was 50 or less was evaluated as "Very good", a case where the number of substrates (among the one thousand substrates) that were evaluated as "Bad" was more than 50 and 100 or less was evaluated as "Good" (acceptable), and a case where the number of substrates (among the one thousand substrates) that were evaluated as "Bad" was more than 100 was evaluated as "Bad" (unacceptable).

4.4. Examples 28 to 31 and Comparative Example 10

A semiconductor treatment composition (concentrated-type semiconductor treatment composition) was prepared in the same manner as in Example 27, except that the composition was changed as listed in Table 3, and a treatment agent (cleaning agent) was prepared in the same manner as in Example 27, except that the composition was changed as listed in Table 3. The wiring board treatment test and the evaluation tests were performed in the same manner as in Example 27.

4.5. Examples 32 to 35 and Comparative Examples 11 to 13

A polyethylene container was charged with each component listed in Table 4 in the ratio listed in Table 4, and the mixture was stirred for 15 minutes.

The resulting composition was filtered in the same manner as in Example 1, except that a filter in which a membrane-type cartridge filter "PE-CLEAN" (manufactured by Pall Corporation, nominal filtration rating: 0.05 micrometers, length: 10 inches) was provided in a housing, was used as the filter 240. The composition was sampled on a timely basis, and filtration was stopped when the number of particles having a particle size of 0.1 to 0.3 micrometers included in the composition had reached the value (concentration) listed in Table 4 to obtain semiconductor treatment compositions (non-dilution-type semiconductor treatment compositions) of Examples 32 to 35 and Comparative Examples 11 to 13. The wiring board treatment test and the evaluation tests were performed in the same manner as in Example 1, except that the semiconductor treatment composition was used directly as the treatment agent (etchant or resist stripper) without being diluted.

4.6. Evaluation Results

The composition of each semiconductor treatment composition and the evaluation results are listed in Tables 1 to 4.

TABLE 1

| | | Example | | | | | | | | |
|---|---|---|---|---|---|---|---|---|---|---|
| | | 1 | 2 | 3 | 4 | 5 | 6 | 7 | 8 | 9 |
| Semiconductor treatment composition (concentrated-type semiconductor treatment composition) | Water-soluble polymer | | | | | | | | | |
| | Polyacrylic acid (Mw = 700,000) | 0.3 | | | | | | | | |
| | Polyacrylic acid (Mw = 55,000) | | 0.1 | | | | | | | |
| | Polyacrylic acid (Mw = 6,000) | | | 1 | | | | | | |
| | Polymaleic acid (Mw = 2,000) | | | | 0.05 | | | | | |
| | Styrene-maleic acid copolymer | | | | | | | 1 | | |
| | Styrene-maleic acid half ester copolymer | | | | | | | | 0.05 | |
| | Naphthalenesulfonic acid-formalin condensate Na salt | | | | | | 0.1 | | | 0.07 |
| Organic acid | Serine | | | | | 0.1 | | | | |
| | Histidine | | | | | | | | | |
| | Arginine | | 1 | | | | | | | |
| | Phenylalanine | | | 1 | | | | | | |
| | Benzoic acid | | | | 0.5 | | | | | |
| | Hydroxyphenyllactic acid | | | | | | | | | |
| | Phenylsuccinic acid | | | | | | | | | |
| | Naphthalenesulfonic acid | 3 | | | | | | | | |
| Amine | Monoethanolamine | | | | | 1 | 1 | | | |
| | Isopropanolamine | 6 | 3 | 2 | 1 | 3 | 3 | 2 | 1.5 | 1.4 |
| K/Na content | $M_K$ (ppm) | $8.4 \times 10^3$ | $2.8 \times 10^3$ | $2.8 \times 10^3$ | $1.3 \times 10^3$ | $2.5 \times 10^3$ | $2.0 \times 10^3$ | $2.6 \times 10^3$ | $1.7 \times 10^4$ | $2.4 \times 10^4$ |
| | $M_{Na}$ (ppm) | $1.8 \times 10^{-1}$ | $3.0 \times 10^{-2}$ | $1.9 \times 10^{-1}$ | $1.5 \times 10^{-2}$ | $2.0 \times 10^{-1}$ | $2.0 \times 10^{-1}$ | $3.0 \times 10^{-1}$ | $1.2 \times 10^{0}$ | $2.8 \times 10^{-1}$ |
| | $M_K/M_{Na}$ | $4.7 \times 10^4$ | $9.3 \times 10^4$ | $1.5 \times 10^4$ | $8.7 \times 10^4$ | $1.3 \times 10^4$ | $1.0 \times 10^4$ | $8.7 \times 10^4$ | $1.4 \times 10^4$ | $8.6 \times 10^4$ |
| Number of particles | Number of particles having particle size of 0.1 to 0.3 micrometers (per mL) | $8.8 \times 10^2$ | $1.4 \times 10^3$ | $5.0 \times 10^1$ | $5.0 \times 10^1$ | $3.0 \times 10^2$ | $2.3 \times 10^2$ | $8.5 \times 10^1$ | $1.4 \times 10^3$ | $1.4 \times 10^3$ |
| | pH | 13.1 | 12.4 | 12.4 | 11.5 | 12.4 | 12.4 | 12.4 | 11.5 | 11.8 |
| Production conditions | During filtration (L/min) | 15 | 20 | 100 | 60 | 30 | 30 | 50 | 30 | 80 |
| | During charge (L/min) | 15 | 20 | 100 | 60 | 30 | 30 | 50 | 30 | 80 |
| | Dilution ratio | 300 | 100 | 100 | 50 | 100 | 100 | 100 | 50 | 70 |
| Treatment agent | pH | 10.6 | 10.8 | 10.8 | 10.6 | 10.6 | 10.4 | 10.6 | 11.8 | 11.8 |
| | Type | Cleaning | Cleaning | Cleaning | Cleaning | Cleaning | Cleaning | Cleaning | Cleaning | Cleaning |
| Evaluation item | Corrosion | Very good | Very good | Very good | Very good | Very good | Very good | Very good | Very good | Very good |
| | Cleaning | Very good | Very good | Very good | Very good | Very good | Very good | Very good | Good | Very good |
| | Reliability | Very good | Very good | Very good | Very good | Very good | Very good | Very good | Very good | Very good |

TABLE 1-continued

| | | Example | | | | | | | |
|---|---|---|---|---|---|---|---|---|---|
| | | 10 | 11 | 12 | 13 | 14 | 15 | 16 | 17 |
| Semiconductor treatment composition (concentrated-type semiconductor treatment composition) | Water-soluble polymer | | | | | | | | |
| | Polyacrylic acid (Mw = 700,000) | 0.14 | | | | | | | |
| | Polyacrylic acid (Mw = 55,000) | | 0.35 | | | | | | |
| | Polyacrylic acid (Mw = 6,000) | | | 0.7 | | | | | 0.2 |
| | Polymaleic acid (Mw = 2,000) | | | | 0.07 | | | | |
| | Styrene-maleic acid copolymer | | | | | 0.1 | | | |
| | Naphthalenesulfonic acid-formalin condensate Na salt | | | | | | 0.2 | 0.1 | |
| Organic acid | Serine | 0.35 | | | | | | | |
| | Histidine | | 0.7 | | | | | | |
| | Arginine | | | 0.35 | | | | | |
| | Phenylalanine | | | | 0.35 | | | | |
| | Benzoic acid | | | | | | 0.5 | | 0.5 |
| | Hydroxyphenyllactic acid | | | | | 0.15 | | | |
| | Phenylsuccinic acid | | | | | | | 0.3 | |
| | Naphthalenesulfonic acid | | | | | | | | |
| Amine | Monoethanolamine | 2.1 | 3.5 | 2.1 | 2.1 | 1 | 3 | 3 | 3 |
| | Isopropanolamine | | | | | 0.5 | | | |
| K/Na content | $M_K$ (ppm) | $2.2 \times 10^4$ | $2.1 \times 10^4$ | $2.2 \times 10^4$ | $2.2 \times 10^4$ | $1.6 \times 10^4$ | $3.2 \times 10^4$ | $3.5 \times 10^4$ | $3.2 \times 10^4$ |
| | $M_{Na}$ (ppm) | $1.7 \times 10^0$ | $1.7 \times 10^0$ | $2.8 \times 10^{-1}$ | $1.7 \times 10^6$ | $2.0 \times 10^{-1}$ | $5.0 \times 10^0$ | $3.0 \times 10^0$ | $1.0 \times 10^0$ |
| | $M_K/M_{Na}$ | $1.3 \times 10^4$ | $1.2 \times 10^4$ | $7.9 \times 10^4$ | $1.3 \times 10^4$ | $8.0 \times 10^4$ | $6.4 \times 10^3$ | $1.2 \times 10^4$ | $3.2 \times 10^4$ |
| Number of particles | Number of particles having particle size of 0.1 to 0.3 micrometers (per mL) | $1.2 \times 10^3$ | $9.5 \times 10^2$ | $1.2 \times 10^2$ | $6.0 \times 10^2$ | $1.5 \times 10^2$ | $1.2 \times 10^3$ | $1.4 \times 10^3$ | $1.1 \times 10^3$ |
| | pH | 13.8 | 13.8 | 13.8 | 13.8 | 13.4 | 13.9 | 13.9 | 13.9 |
| Production conditions | During filtration (L/min) | 80 | 60 | 20 | 40 | 20 | 80 | 120 | 100 |
| | During charge (L/min) | 80 | 60 | 20 | 40 | 20 | 80 | 120 | 100 |
| | Dilution ratio | 70 | 70 | 70 | 70 | 50 | 100 | 100 | 100 |
| Treatment agent | pH | 11.7 | 11.5 | 11.7 | 11.7 | 11.6 | 11.7 | 11.8 | 11.7 |
| Evaluation item | Type | Cleaning | Cleaning | Cleaning | Cleaning | Cleaning | Cleaning | Cleaning | Cleaning |
| | Corrosion | Very good | Very good | Very good | Very good | Very good | Very good | Very good | Very good |
| | Cleaning | Very good | Very good | Very good | Very good | Very good | Very good | Very good | Very good |
| | Reliability | Very good | Very good | Very good | Very good | Very good | Very good | Very good | Very good |

TABLE 2

| | | Example | | | | | | | | |
|---|---|---|---|---|---|---|---|---|---|---|
| | | 18 | 19 | 20 | 21 | 22 | 23 | 24 | 25 | 26 |
| Semiconductor treatment composition (concentrated-type semiconductor treatment composition) | Water-soluble polymer | | | | | | | | | |
| | Polyacrylic acid (Mw = 700,000) | | | | 0.5 | 0.005 | 56 | | | 2 |
| | Polyacrylic acid (Mw = 6,000) | | | | | | | | 60 | |
| | Polymaleic acid (Mw = 2,000) | | | | | | | 1.4 | | |
| | Polyallylamine (Mw = 25,000) | | 0.1 | | | | | | | |
| | Polyallylamine (Mw = 15,000) | 0.25 | | | | | | | | |
| | Polystyrenesulfonic acid (Mw = 50,000) | | | 3.5 | | | | | | |
| | Styrene-maleic acid copolymer | | | | | | | | | |
| | Styrene-maleic acid half ester copolymer | | | | | | | | | |
| | Polyvinyl alcohol (Mw = 26,000) | | | | | | | | | |
| | Polyethyleneimine (Mw = 70,000) | | | | | | | | | |
| Organic acid | Aspartic acid | 0.25 | 0.3 | | | | | | | 120 |
| | Histidine | | | | | 0.3 | | | | |
| | Arginine | | | | 0.005 | | | | | |
| | Phenylalanine | | | 0.35 | | | | | | |
| | Hydroxyphenyllactic acid | | | | | | | 56 | 0.15 | |
| | Phenylsuccinic acid | | | | | | 2.1 | | | |
| Amine | Monoethanolamine | 1.5 | | 1.4 | 3 | 3 | | 2.1 | 1.5 | 1 |
| | Isopropanolamine | | 5 | | | | 1.4 | | | 2 |
| Other | Benzotriazole | | | | | | 0.7 | | | |
| | Imidazole | | | | | | | | | |
| K/Na content | $M_K$ (ppm) | $1.6 \times 10^4$ | $3.5 \times 10^4$ | $2.1 \times 10^4$ | $3.2 \times 10^4$ | $3.5 \times 10^4$ | $8.4 \times 10^3$ | $2.2 \times 10^4$ | $5.0 \times 10^3$ | $3.2 \times 10^4$ |
| | $M_{Na}$ (ppm) | $4.5 \times 10^{-1}$ | $3.0 \times 10^0$ | $5.6 \times 10^1$ | $3.0 \times 10^0$ | $5.0 \times 10^0$ | $7.0 \times 10^{-1}$ | $1.4 \times 10^0$ | $1.0 \times 10^{-1}$ | $1.0 \times 10^0$ |
| | $M_K/M_{Na}$ | $3.6 \times 10^4$ | $1.2 \times 10^4$ | $3.8 \times 10^4$ | $1.1 \times 10^4$ | $7.0 \times 10^3$ | $1.2 \times 10^4$ | $1.6 \times 10^4$ | $5.0 \times 10^4$ | $3.2 \times 10^4$ |
| Number of particles | Number of particles having particle size of 0.1 to 0.3 micrometers (per mL) | $2.3 \times 10^2$ | $1.3 \times 10^3$ | $7.2 \times 10^2$ | $1.4 \times 10^3$ | $1.5 \times 10^3$ | $1.0 \times 10^3$ | $1.2 \times 10^3$ | $4.8 \times 10^2$ | $1.0 \times 10^3$ |
| | pH | 13.4 | 13.9 | 13.8 | 13.9 | 13.9 | 13.8 | 13.8 | 13.4 | 13.8 |
| Production conditions | During filtration (L/min) | 20 | 120 | 40 | 120 | 120 | 80 | 100 | 30 | 100 |
| | During charge (L/min) | 20 | 120 | 40 | 120 | 120 | 80 | 100 | 30 | 100 |
| | Dilution ratio | 50 | 100 | 70 | 100 | 100 | 70 | 70 | 50 | 100 |
| Treatment agent | pH | 11.7 | 11.8 | 11.5 | 11.7 | 11.8 | 9.5 | 11.7 | 9.3 | 11.7 |
| | Type | Cleaning | Cleaning | Cleaning | Cleaning | Cleaning | Cleaning | Cleaning | Cleaning | Cleaning |
| Evaluation item | Corrosion | Very good | Very good | Very good | Very good | Very good | Very good | Very good | Very good | Very good |
| | Cleaning | Very good | Very good | Very good | Very good | Very good | Very good | Very good | Very good | Very good |
| | Reliability | Very good | Good | Very good | Good | Good | Very good | Very good | Very good | Very good |

TABLE 2-continued

| | | Comparative Example | | | | | | | | |
|---|---|---|---|---|---|---|---|---|---|---|
| | | 1 | 2 | 3 | 4 | 5 | 6 | 7 | 8 | 9 |
| Semiconductor treatment composition (concentrated-type semiconductor treatment composition) | Water-soluble polymer | | | | | | | | | |
| | Polyacrylic acid (Mw = 700,000) | | | | | | | | | |
| | Polyacrylic acid (Mw = 6,000) | | | | | | | | | 0.05 | |
| | Polymaleic acid (Mw = 2,000) | | | | | | | | | |
| | Polyallylamine (Mw = 25,000) | | | | | | 0.07 | | | |
| | Polyallylamine (Mw = 15,000) | | | | | | | | | |
| | Polystyrenesulfonic acid (Mw = 50,000) | | | | | | | | | |
| | Styrene-maleic acid copolymer | | | 0.2 | | | | | | |
| | Styrene-maleic acid half ester copolymer | | | | | | | | | |
| | Polyvinyl alcohol (Mw = 26,000) | | | | 0.5 | | | | | |
| | Polyethylenimine (Mw = 70,000) | | | | | | | | | 0.25 |
| Organic acid | Aspartic acid | | | | | | | | | |
| | Histidine | | | | | | | 0.5 | | |
| | Arginine | | | | | | | 0.5 | | |
| | Phenylalanine | | | | | | | | | |
| | Hydroxyphenyllactic acid | | | | | | | | | |
| | Phenylsuccinic acid | | | | | | | | | |
| Amine | Monoethanolamine | 2 | 3 | | 5 | 3 | 2.1 | 3 | 0.3 | 1.5 |
| | Isopropanolamine | | | | | | | | | |
| Other | Benzotriazole | | | | | 0.5 | | | 0.02 | 0.05 |
| | Imidazole | | | | | | | | | |
| K/Na content | $M_K$ (ppm) | $3.0 \times 10^3$ | $4.2 \times 10^3$ | $5.2 \times 10^3$ | $1.3 \times 10^4$ | $3.2 \times 10^4$ | $2.2 \times 10^4$ | $3.2 \times 10^4$ | $3.2 \times 10^3$ | $1.6 \times 10^4$ |
| | $M_{Na}$ (ppm) | $1.0 \times 10^{-2}$ | $3.0 \times 10^1$ | $2.0 \times 10^0$ | $2.5 \times 10^1$ | $1.0 \times 10^1$ | $3.5 \times 10^{-1}$ | $2.0 \times 10^0$ | $1.0 \times 10^{-2}$ | $1.0 \times 10^0$ |
| | $M_K/M_{Na}$ | $3.0 \times 10^5$ | $1.4 \times 10^2$ | $2.6 \times 10^3$ | $5.2 \times 10^2$ | $3.2 \times 10^3$ | $6.3 \times 10^4$ | $1.6 \times 10^4$ | $3.2 \times 10^5$ | $1.6 \times 10^4$ |
| Number of particles | Number of particles having particle size of 0.1 to 0.3 micrometers (per mL) | $1.0 \times 10^1$ | $1.7 \times 10^3$ | $2.2 \times 10^3$ | $1.7 \times 10^3$ | $3.2 \times 10^3$ | $1.6 \times 10^3$ | $2.8 \times 10^3$ | $2.0 \times 10^1$ | $2.0 \times 10^3$ |
| | pH | 12.4 | 12.7 | 12.9 | >14.0 | 13.9 | 13.8 | 13.9 | 12.7 | 13.4 |
| Production conditions | During filtration (L/min) | 20 | 20 | 160 | 120 | 40 | 60 | 200 | 20 | 170 |
| | During charge (L/min) | 20 | 20 | 160 | 120 | 40 | 60 | 200 | 20 | 100 |
| | Dilution ratio | 100 | 150 | 200 | 500 | 100 | 70 | 100 | 10 | 50 |
| Treatment agent | pH | 11.0 | 10.9 | 10.6 | 10.6 | 11.7 | 11.7 | 11.7 | 11.7 | 11.7 |
| | Type | Cleaning | Cleaning | Cleaning | Cleaning | Cleaning | Cleaning | Cleaning | Cleaning | Cleaning |
| Evaluation item | Corrosion | Bad | Bad | Very good | Very good | Very good | Bad | Very good | Bad | Very good |
| | Cleaning | Bad | Bad | Very good | Very good | Bad | Very good | Bad | Bad | Bad |
| | Reliability | Bad | Bad | Bad | Bad | Bad | Bad | Bad | Bad | Bad |

TABLE 3

| | | | Example | | | | | Comparative Example |
|---|---|---|---|---|---|---|---|---|
| | | | 27 | 28 | 29 | 30 | 31 | 10 |
| Semiconductor treatment composition (concentrated-type semiconductor treatment composition) | Water-soluble polymer | Polyacrylic acid (Mw = 700,000) | | | | | 0.1 | 0.3 |
| | | Polyacrylic acid (Mw = 55,000) | | | | 0.21 | | |
| | | Polyacrylic acid (Mw = 6,000) | 0.1 | 0.6 | | | | |
| | Organic acid | Serine | | | | | | 1 |
| | | Histidine | 1 | 2 | 0.5 | | | |
| | | Arginine | | | | | 1 | |
| | Amine | Monoethanolamine | 0.3 | 0.3 | | 0.28 | | |
| | | Isopropanolamino | | | | | | |
| | Other | Ammonium dodecylbenzenesulfonate | | | 0.5 | | | |
| | | Ammonium alkyliminodicarboxylate | | | | 0.35 | | |
| | K/Na content | $M_K$ (ppm) | $3.0 \times 10^{-1}$ | $4.0 \times 10^{-1}$ | $1.5 \times 10^{-1}$ | $1.4 \times 10^{-1}$ | $2.0 \times 10^{-1}$ | $1.0 \times 10^{-1}$ |
| | | $M_{Na}$ (ppm) | $5.0 \times 10^{-5}$ | $2.0 \times 10^{-5}$ | $5.0 \times 10^{-6}$ | $7.0 \times 10^{-6}$ | $2.0 \times 10^{-5}$ | $6.0 \times 10^{-2}$ |
| | | $M_K/M_{Na}$ | $6.0 \times 10^{3}$ | $2.0 \times 10^{4}$ | $3.0 \times 10^{4}$ | $2.0 \times 10^{4}$ | $1.0 \times 10^{4}$ | $1.7 \times 10^{0}$ |
| | Number of particles | Number of particles having particle size of 0.1 to 0.3 micrometers (per mL) | $3.0 \times 10^{1}$ | $6.1 \times 10^{2}$ | $7.7 \times 10^{2}$ | $6.0 \times 10^{1}$ | $1.0 \times 10^{3}$ | $1.6 \times 10^{3}$ |
| | | pH | 4.0 | 4.8 | 2.5 | 4.4 | 2.5 | 4.2 |
| Production conditions | Flow rate | During filtration (L/min) | 60 | 100 | 120 | 20 | 120 | 100 |
| | | During charge (L/min) | 60 | 100 | 120 | 20 | 120 | 100 |
| | | Dilution ratio | 100 | 200 | 50 | 70 | 100 | 100 |
| Treatment agent | | pH | 5.0 | 4.8 | 2.5 | 4.7 | 3.0 | 4.5 |
| | | Type | Cleaning | Cleaning | Cleaning | Cleaning | Cleaning | Cleaning |
| Evaluation item | | Corrosion | Very good | Very good | Very good | Very good | Very good | Very good |
| | | Cleaning | Very good | Very good | Very good | Very good | Very good | Bad |
| | | Reliability | Very good | Very good | Very good | Very good | Very good | Bad |

TABLE 4

| | | | Example | | | | Comparative Example | | |
|---|---|---|---|---|---|---|---|---|---|
| | | | 32 | 33 | 34 | 35 | 11 | 12 | 13 |
| Semiconductor treatment composition (non-dilution-type semiconductor treatment composition) | Water-soluble polymer | Polyacrylic acid (Mw = 700,000) | | 0.03 | | | | 3 | |
| | | Polymaleic acid (Mw = 2,000) | | | | 0.05 | | | 0.01 |
| | Organic acid | Serine | | 0.2 | | | | | |
| | | Cysteine | | | | | | | 0.05 |
| | | Histidine | | | | 0.1 | | | |
| | | Naphthalene-sulfonic acid | 0.1 | | | | | 0.05 | |
| | Solvent | 2-P | | | | | 30 | | |
| | | PG | 35 | 25 | 10 | | 20 | 45 | 10 |
| | | PGME | 15 | | | 20 | | | |
| | | NMP | | | 30 | 20 | | | |
| | | Sulfolane | 30 | | | | | 30 | 30 |
| | Other | KOH | | | | 0.5 | | | |
| | | TMAH | 1.5 | | | | | | |
| | | TEAH | | | 3 | | 1 | | |
| | | Choline | | 2.5 | | | | | |
| | | Monomethyl-trihydroxy-ethylammonium hydroxide | | | | | | 2 | 2 |
| | | Dimethylbis-(2-hydroxyethyl)-ammonium hydroxide | 1.5 | | | | | | |
| | | Ammonium hydroxide | | | | | | | 5 |
| | K/Na content | $M_K$ (ppm) | $3.2 \times 10^{0}$ | $2.5 \times 10^{0}$ | $2.0 \times 10^{0}$ | $3.5 \times 10^{1}$ | $7.0 \times 10^{1}$ | $3.0 \times 10^{-1}$ | $3.0 \times 10^{-1}$ |
| | | $M_{Na}$ (ppm) | $6.0 \times 10^{-4}$ | $3.2 \times 10^{-5}$ | $2.5 \times 10^{-5}$ | $5.0 \times 10^{-3}$ | $1.7 \times 10^{0}$ | $1.2 \times 10^{-4}$ | $1.2 \times 10^{-5}$ |
| | | $M_K/M_{Na}$ | $5.3 \times 10^{3}$ | $7.8 \times 10^{4}$ | $8.0 \times 10^{4}$ | $7.0 \times 10^{3}$ | $4.1 \times 10^{1}$ | $2.5 \times 10^{3}$ | $1.5 \times 10^{3}$ |
| | Number of particles | Number of particles having particle size of 0.1 to 0.3 | $3.0 \times 10^{1}$ | $3.5 \times 10^{1}$ | $3.2 \times 10^{1}$ | $4.2 \times 10^{1}$ | ND | $1.3 \times 10^{1}$ | $2.0 \times 10^{0}$ |

TABLE 4-continued

| | | Example | | | | Comparative Example | | |
|---|---|---|---|---|---|---|---|---|
| | | 32 | 33 | 34 | 35 | 11 | 12 | 13 |
| | micrometers (per mL) | | | | | | | |
| | pH | >14 | >14 | >14 | >14 | >14 | >14 | >14 |
| | Type of treatment agent | Resist removal | Resist removal | Etching | Etching | Etching | Resist removal | Resist removal |
| Evaluation item | Corrosion | Very good | Very good | Good | Good | Bad | Very good | Bad |
| | Cleaning | Very good | Very good | Very good | Very good | Very good | Bad | Very good |
| | Reliability | Good | Very good | Very good | Good | Bad | Very good | Very good |

In Tables 1 to 4, the unit for the amount (ratio) of each component is "parts by mass". In each example and comparative example, the total amount of the components was 100 parts by mass, and the balance was ion-exchanged water. The details of each component listed in Tables 1 to 4 are as follows.

<Water-Soluble Polymer>

Polyacrylic acid (Mw=700,000): "JURYMER AC-10H" manufactured by Toagosei Co., Ltd.

Polyacrylic acid (Mw=55,000): "JURYMER AC-10L" manufactured by Toagosei Co., Ltd.

Polyacrylic acid (Mw=6,000): "ARON A-10SL" manufactured by Toagosei Co., Ltd.

Polymaleic acid (Mw=2,000): "NONPOL PWA-50W" manufactured by NOF Corporation

Polyallylamine (Mw=25,000): "PAA-25" manufactured by Nittobo Medical Co., Ltd.

Polyallylamine (Mw=15,000): "PAA-15" manufactured by Nittobo Medical Co., Ltd.

Polystyrenesulfonic acid (Mw=50,000): "PS-5H" manufactured by Tosoh Organic Chemical Co., Ltd.

Styrene-maleic acid copolymer: "DKS DISCOAT N-10" manufactured by DKS Co. Ltd.

Styrene-maleic acid half ester copolymer: "DKS DISCOAT N-14" manufactured by DKS Co. Ltd.

Naphthalenesulfonic acid-formalin condensate Na salt: "LAVELIN FD-40" manufactured by DKS Co. Ltd.

Polyvinyl alcohol (Mw=26,000): "PVA405" manufactured by Kuraray Co., Ltd.

Polyethylenimine (Mw=70,000): "EPOMIN P-1000" manufactured by Nippon Shokubai Co., Ltd.

<Organic Acid>

Serine: manufactured by Nippon Rika Co., Ltd.
Cysteine: manufactured by Nippon Rika Co., Ltd.
Histidine: manufactured by Nippon Rika Co., Ltd.
Arginine: manufactured by Nippon Rika Co., Ltd.
Aspartic acid: manufactured by Nippon Rika Co., Ltd.
Phenylalanine: manufactured by Kyowa Hakko Bio Co., Ltd.
Benzoic acid: manufactured by DMS Japan
Hydroxyphenyllactic acid: manufactured by Tokyo Kasei Kogyo Co., Ltd.
Phenylsuccinic acid: manufactured by Tokyo Kasei Kogyo Co., Ltd.
Naphthalenesulfonic acid: manufactured by Wako Pure Chemical Industries, Ltd.
Maleic acid: manufactured by Fuso Chemical Co., Ltd.

<Amine>

Monoethanolamine: manufactured by Hayashi Pure Chemical Ind., Ltd.
Isopropanolamine: manufactured by Toko Chemicals Inc.

<Other>

Benzotriazole: manufactured by Johoku Chemical Co., Ltd. (rust preventive)
Imidazole: manufactured by Shikoku Chemicals Corporation (rust preventive)
Ammonium dodecylbenzenesulfonate: manufactured by Tama Chemicals Co., Ltd. (surfactant)
Ammonium alkyliminodicarboxylate: manufactured by Takemoto Oil & Fat Co., Ltd. (surfactant)
TMAH (tetramethylammonium hydroxide): manufactured by Hayashi Pure Chemical Ind., Ltd. (pH-adjusting agent)
TEAH (tetraethylammonium hydroxide): manufactured by Junsei Chemical Co., Ltd. (pH-adjusting agent)
Choline: manufactured by Tama Chemicals Co., Ltd. (pH-adjusting agent)
Monomethyltrihydroxyethylammonium hydroxide: manufactured by Yokkaichi Chemical Co., Ltd. (pH-adjusting agent)
Dimethylbis(2-hydroxyethyl)ammonium hydroxide: manufactured by Yokkaichi Chemical Co., Ltd. (pH-adjusting agent)
KOH: manufactured by Kanto Chemical Co., Inc. (pH-adjusting agent)
Ammonium hydroxide: manufactured by Hayashi Pure Chemical Ind., Ltd. (pH-adjusting agent)

<Solvent>

2-P (2-pyrrolidone): manufactured by Wako Pure Chemical Industries, Ltd.
PG (propylene glycol): manufactured by Wako Pure Chemical Industries, Ltd.
PGME (propylene glycol monomethyl ether): manufactured by Sankyo Chemical Co., Ltd.
NMP (N-methylpyrrolidone): manufactured by Mitsubishi Chemical Corporation
Sulfolane: manufactured by Sankyo Chemical Co., Ltd.

As is clear from Tables 1 to 4, when the semiconductor treatment compositions of Examples 1 to 35 were used, corrosion of the surface of the substrate was suppressed, the number of defects was small, and an excellently treated state could be obtained.

The invention is not limited to the embodiments described above. Various modifications and variations may be made of the embodiments described above. For example, the invention includes various other configurations substantially the same as the configurations described above in connection with the embodiments (e.g., a configuration having the same function, method, and results, or a configuration having the same objective and results). The invention also includes a configuration in which an unsubstantial element described above in connection with the embodiments is replaced by another element. The invention also includes a configuration having the same effects as those of the configurations described above in connection with the embodiments, or a configuration capable of achieving the same objective as that of the configurations described above in connection with the embodiments. The invention further includes a configuration in which a known technique is added to the configurations described above in connection with the embodiments.

Although only some embodiments of the invention have been described in detail above, those skilled in the art would readily appreciate that many modifications are possible in the embodiments without materially departing from the novel teachings and advantages of the invention. Accordingly, all such modifications are intended to be included within the scope of the invention.

What is claimed is:

1. A semiconductor treatment composition comprising:
   particles having a particle size of 0.1 to 0.3 micrometers in a number of $3\times10^1$ to $1.5\times10^3$ per mL,
   wherein the particles include at least one particles selected from a group consisting of metal particles and metal oxide particles.

2. The semiconductor treatment composition according to claim 1, the semiconductor treatment composition being used in a 1 to 500-fold diluted state.

3. The semiconductor treatment composition according to claim 1, further comprising an organic acid.

4. The semiconductor treatment composition according to claim 1, further comprising a water-soluble polymer.

5. The semiconductor treatment composition according to claim 4, wherein the weight average molecular weight (Mw) of the water-soluble polymer is from 1,000 to 1,500,000.

6. The semiconductor treatment composition according to claim 1, further comprising an amine.

7. The semiconductor treatment composition according to claim 1, wherein said particles comprise 30 parts by mass or more, based on 100 parts by mass of the total mass of said particles, which have a ratio (Rmax/Rmin) of the major axis (Rmax) to the minor axis (Rmin) of 1.3 or more.

8. The semiconductor treatment composition according to claim 1, wherein said particles comprise 30 parts by mass or more, based on 100 parts by mass of the total mass of said particles, which have a ratio (Rmax/Rmin) of the major axis (Rmax) to the minor axis (Rmin) of 1.4 to 3.0.

9. A treatment method comprising:
   treating a wiring board by using the semiconductor treatment composition according to claim 1, the wiring board containing a wiring material and a barrier metal material, the wiring material being copper or tungsten, and the barrier metal material being at least one material selected from a group consisting of tantalum, titanium, cobalt, ruthenium, manganese, and compounds thereof.

10. A treatment method comprising:
    treating a wiring board that contains tungsten as a wiring material by using the semiconductor treatment composition according to claim 1, after subjecting the wiring board to chemical mechanical polishing by using a composition that contains iron ions and peroxides.

11. A semiconductor treatment composition comprising:
    particles having a particle size of 0.1 to 0.3 micrometers in a number of $3\times10^1$ to $1.5\times10^3$ per mL,
    wherein the particles include silica particles.

12. The semiconductor treatment composition according to claim 11, the semiconductor treatment composition being used in a 1 to 500-fold diluted state.

13. The semiconductor treatment composition according to claim 11, further comprising an organic acid.

14. The semiconductor treatment composition according to claim 11, further comprising a water-soluble polymer.

15. The semiconductor treatment composition according to claim 14, wherein the weight average molecular weight (Mw) of the water-soluble polymer is from 1,000 to 1,500,000.

16. The semiconductor treatment composition according to claim 11, further comprising an amine.

17. The semiconductor treatment composition according to claim 11, wherein said particles comprise 30 parts by mass or more, based on 100 parts by mass of the total mass of said particles, which have a ratio (Rmax/Rmin) of the major axis (Rmax) to the minor axis (Rmin) of 1.3 or more.

18. The semiconductor treatment composition according to claim 11, wherein said particles comprise 30 parts by mass or more, based on 100 parts by mass of the total mass of said particles, which have a ratio (Rmax/Rmin) of the major axis (Rmax) to the minor axis (Rmin) of 1.4 to 3.0.

19. A treatment method comprising:
    treating a wiring board by using the semiconductor treatment composition according to claim 11, the wiring board containing a wiring material and a barrier metal material, the wiring material being copper or tungsten, and the barrier metal material being at least one material selected from a group consisting of tantalum, titanium, cobalt, ruthenium, manganese, and compounds thereof.

20. A treatment method comprising:
    treating a wiring board that contains tungsten as a wiring material by using the semiconductor treatment composition according to claim 11, after subjecting the wiring board to chemical mechanical polishing by using a composition that contains iron ions and peroxides.

* * * * *